US009092592B2

(12) United States Patent
Perasso

(10) Patent No.: US 9,092,592 B2
(45) Date of Patent: Jul. 28, 2015

(54) DATA STRUCTURE FOR A LIST OF PARTS

(75) Inventor: Gregory Perasso, Thonon les Bains (FR)

(73) Assignee: TURBOMECA, Bordes (FR)

( * ) Notice: Subject to any disclaimer, the term of this patent is extended or adjusted under 35 U.S.C. 154(b) by 893 days.

(21) Appl. No.: 13/265,604

(22) PCT Filed: May 3, 2010

(86) PCT No.: PCT/FR2010/050833
§ 371 (c)(1),
(2), (4) Date: Oct. 21, 2011

(87) PCT Pub. No.: WO2010/128236
PCT Pub. Date: Nov. 11, 2010

(65) Prior Publication Data
US 2012/0041723 A1    Feb. 16, 2012

(30) Foreign Application Priority Data

May 4, 2009  (FR) ...................................... 09 52941

(51) Int. Cl.
*G06F 17/50*  (2006.01)
(52) U.S. Cl.
CPC .................................. *G06F 17/5086* (2013.01)
(58) Field of Classification Search
CPC .................................................. G06F 17/5086
USPC .................... 703/1; 700/97–98; 345/419–420
See application file for complete search history.

(56) References Cited

U.S. PATENT DOCUMENTS

| 5,485,560 | A  | * | 1/1996 | Ishida et al. ................... 345/619 |
| 7,584,211 | B2 | * | 9/2009 | Tamaru et al. ......................... 1/1 |
| 2005/0033559 | A1 | * | 2/2005 | Wander .............................. 703/1 |
| 2005/0038537 | A1 | * | 2/2005 | Okada et al. ..................... 700/97 |
| 2009/0132215 | A1 | * | 5/2009 | Inoke et al. ........................ 703/2 |

OTHER PUBLICATIONS

Ameri, F., et al., "Product Lifecycle Management: Closing the Knowledge Loops," Computer-Aided Design & Applications, vol. 2, No. 5, pp. 577-590, (2005) XP-002557777.
International Search Report Issued Sep. 1, 2010 in PCT/FR10/050833 Filed May 3, 2010.

* cited by examiner

*Primary Examiner* — Eunhee Kim
(74) *Attorney, Agent, or Firm* — Oblon, McCelland, Maier & Neustadt, L.L.P.

(57) ABSTRACT

A data structure for a parts list of a mechanical device, the parts list including at least one set including at least one element selected from a component and a set of components. The structure includes: an identifier of the set; an identifier of the element; at least one link between the identifier of the element and at least one CAD file including a geometrical representation of the element; at least one link between the identifier of the set and at least one data file including a three-dimensional positioning matrix of the at least one element of the set, together with at least one pointer to the CAD file containing the geometrical representation of the element of the set; and a three-dimensional positioning vector for positioning the element in the set.

11 Claims, 3 Drawing Sheets

DATA STRUCTURE FOR A LIST OF PARTS

The present invention relates to the field of designing complex mechanical devices, e.g. such as parts for engines, and particularly but not exclusively aircraft turbine engines.

The term "mechanical device" is also used to cover any device made up of an assembly of components, such as for example an electronics card, or indeed any equipment or other device of this type.

Nowadays, such devices are designed essentially with the help of computer-assisted design (CAD) software or software packages.

Such software packages enable drafters to draw the various parts making up the device, usually in three dimensions, and to assemble them with one another in order to make up the device. Such geometrical representations may be viewed on a computer screen. The drafter can cause the geometrical representations to move and may optionally modify them.

The geometrical representation of the entire mechanical device is generally referred to as a digital model or CAD model of the device, with the geometrical representations being stored in one or more computer files, referred to as CAD files.

It can be understood that for a complex device, e.g. such as an aircraft turbine engine, creating a CAD model requires several thousands of hours of work and thus represents a large investment.

Nowadays there exist several CAD software packages on the market, each having its own CAD file format.

Furthermore, those various software packages are not necessarily mutually compatible, which means that a first CAD file generated by a first software package with a first file format and containing a geometrical representation of a part in that first format will generally not be readable and modifiable by a software package of some other file format.

In order to solve that problem of compatibility, translation software has been created. Nevertheless, on translating from one format to another, a large amount of information is lost, such that it is no longer possible to modify the "translation" of the geometrical representation, and it is only possible to view it.

It can thus be understood that when a user desires to change software package, there is generally no option available other than redrafting all of the parts of the mechanical devices while using the new software package. Such a large amount of work generally represents a dissuasive cost, and as a result, the users of any one software package tend to buy new versions of that package rather than change to another package.

It should be added that a CAD package is generally associated with other software having the function in particular of managing the list of parts making up the mechanical device. Such software is generally referred to as product lifecycle management (PLM) software.

The idea is to manage parts lists while they are being configured, i.e. to filter such lists in accordance with a criterion. A complex assembly may have several variants: the parts lists retains the same structure but some of the parts are modified. This often happens in particular when an engine is a small departure from an existing engine, or when there are alternatives (options) concerning a component, or when a component is modified because of a safety problem during the lifetime of the engine. Little by little, the parts list expands into several alternatives, each of which may be associated with a context of use.

The PLM serves in particular to filter the parts list that is correct for a given context.

In known manner, a parts list is a list of the various parts or components making up the mechanical device. It specifies in particular the sets and the subsets of components making up the mechanical device.

For example, the parts list for a helicopter turbine engine includes in particular a set of components referred to as a "compression stage", which set contains a "compressor wheel" component and a "diffuser" component. Thus, in the CAD model there is a first CAD file containing the geometrical representation of the compressor wheel, a second CAD file containing the geometrical representation of the diffuser, and a third CAD file containing pointers to the above-mentioned first and second files, together with a three-dimensional positioning matrix giving the position of the compressor wheel relative to the diffuser. Opening the third CAD file makes it possible to view and modify the geometrical representation of the set of components.

At present, there is no consistency between the parts list and the CAD model of the mechanical device. In other words, making a modification to the parts list does not automatically give rise to a modification in the CAD file. Adding a component, for example a second diffuser, to a pre-existing "compression stage" set of components needs to be associated with manually creating a new CAD file associated with the new set of components. Similarly, modifying the CAD file associated with the "compression stage" set of components, e.g. by removing the diffuser, does not have automatic repercussions in the parts list.

This lack of consistency between the CAD model and the parts list obliges the user to keep them up to date in parallel, which requires rigor and a great deal of time when the device is complex.

A first object of the present invention is to remedy this drawback by proposing a data structure for a parts list of a mechanical device, the parts list comprising at least one set including at least one element taken from a component or a set of components, said data structure serving to link the parts list actively to the CAD model of said device. The invention achieves its object by the fact that said structure comprises:
- an identifier of the set;
- an identifier of the element;
- at least one link between the identifier of the element and at least one CAD file containing the geometrical representation of the element;
- at least one link between the identifier of the set and at least one data file containing a three-dimensional positioning matrix of said at least one element of the set, together with at least one pointer to said CAD file containing the geometrical representation of the element of the set; and
- a three-dimensional positioning vector for positioning said element.

It can thus be understood that the links serve to set up dependency between the data structure of the parts list and the various CAD files of the CAD model, it being specified that the data file is also a file of CAD type.

Such a data structure is for associating with a CAD model containing at least one file format of CAD type. The invention makes it possible in particular to synchronize the CAD model, i.e. the set of CAD files relating to the mechanical device, with the parts list.

In this way, the structure of the CAD model may advantageously be imposed by the parts list, with any modification made to the parts list having repercussions in the CAD model.

Furthermore, and according to the invention, the present data structure advantageously contains the three-dimensional positioning vector for the or each element. An advantage is that in the event of the CAD data file being lost, the data structure of the parts list makes it very easy to retrieve the three-dimensional positioning of the element in the set, and thus enables a data file to be reconstructed.

Another advantage is to be able to view the CAD model in the parts list management software, which avoids any need to make use also of the CAD software package merely for the purpose of viewing the set.

It is specified that the data structure also includes a parts list link between the identifier of the set and the identifier of the element.

Advantageously, the data structure further includes means for updating the three-dimensional positioning vector from the three-dimensional positioning matrix as contained in the data file.

Thus, as soon as the position of two components in the set is modified in the CAD software package, this modification is updated in the data structure and thus in the parts list management software. It can be understood that this operation enables the parts list and the CAD model to be synchronized concerning the three-dimensional positions of the components of the set.

In a very advantageous embodiment of the invention, said at least one element is a component and said data structure includes a first link between the identifier of the component and a first CAD file containing the geometrical representation of the component in a first format, and at least one second link between the identifier of the component and a second CAD file containing a geometrical representation of the component in a second format.

Such a data structure serves to mitigate the above-mentioned problem of compatibility. Instead of completely restarting a CAD model by drawing all of the parts or components again, the invention enables a user to allow a plurality of file formats to co-exist.

Preferably, the first format is a format readable by a first software package while the second format is a format readable by a second software package. The first format may be the native format of the first package or it may be a translated format that can be understood by the first package. Similarly, the second format may be the native format of the second package or it may be a translated format that can be understood by the second package. A geometrical representation in a translated format is usually readable but not modifiable. Below, the term "native" CAD file is used to designate a file created by a CAD software package.

Still preferably, the first format of the first CAD file is the native format of the first package, while the second format is a translated format readable by the second package, thereby enabling two packages that work in different formats to co-exist.

Without going beyond the ambit of the present invention, it is possible to make a greater number of file formats co-exist by creating a corresponding number of format links.

This co-existence is made possible by the first and second links that connect the identifier of the component to the CAD files containing its geometrical representation in the various formats.

Preferably, the data structure further comprises:
a first link between the identifier of the set and a first data file containing at least:
the three-dimensional positioning matrix; and
a pointer to the first CAD file; and
a second link between the identifier of the set and a second data file containing at least:
the three-dimensional positioning matrix; and
a pointer to the second CAD file.

It can thus be understood that the data structure is also linked to the CAD model by links between the identifier of the set and the data files associated with the set.

Preferably, the first data file is written in the first format while the second data file is written in the second format.

Saying that the first data file is written in the first format means that it is at least readable by the package that has said first format as its file format. The same applies to the second data file.

Preferably, the first and second data files are native CAD files.

It can also be understood that the data files do not contain directly the CAD files containing the geometrical representations of the components of the set, but enable the package to find those files by means of the pointers.

As described above, the data structure serves to allow two software packages having different file formats to co-exist. For example, if the component was designed using the first package in the first format and the user seeks to modify the component in the set, then the first data file is opened using the first package. Under such circumstances, the second CAD file will be a CAD file translated into the second format as obtained from the first CAD file. The user can thus view the component of the set by opening the second data file with the second package.

Preferably, one of the two formats is of the CATIA V5 type (a product sold by the supplier Dassault Systemes). In other words, at least one of the two packages is CATIA V5, while the other package may for example be CADDS (a product sold by the supplier PTC).

Advantageously, the data structure further comprises, for each element, a link to a file containing a geometrical representation of said element in a neutral format.

One advantage is to be able to view the representation of said element directly in the parts list management software without making use of the CAD package(s). To make this possible, the parts list management software is suitable for reading the neutral format. The geometrical representation in the neutral format comes from the translation into said format from the native CAD file. Particular known neutral formats are the STEP and IGES formats.

The present invention also provides a recording medium readable by a computer and having recorded thereon the data structure of the invention.

By way of non-exclusive example, such a recording medium may be a hard disk, a non-volatile memory, a compact disk (CD), or indeed a digital video disk (DVD).

Furthermore, the present invention also provides an addition method for adding a new component to a pre-existing set of a parts list of a mechanical device, particularly but not exclusively a helicopter turbine engine, said parts list having a data structure of the invention, said structure being for associating with a CAD model that includes a plurality of file formats, the method comprising:
a step of creating in said data structure an identifier of a new set containing the elements of the pre-existing set and the new component;
a step during which a native CAD file is provided that contains the geometrical representation of the new component in a first format;
a step of creating at least one other CAD file containing the geometrical representation of the new component in at least one other format, by translating said native CAD file to said other format;
a step of creating in said data structure a first link between the identifier of the new component and the native CAD file;

for each other format, a step of creating a link in the data structure between the identifier of the new component and the CAD file written in said other format;

a step of creating a first data file associated with the new set, written in the first format, and containing a new three-dimensional positioning matrix constituted by the three-dimensional positioning matrix of the elements of the pre-existing set and a new component positioning vector, together with pointers to the CAD files written in the first format and associated with the geometrical representations of the elements of the pre-existing set, and a pointer to the native CAD file;

a step of creating a first link in said data structure between the identifier of the new set and the first data file;

a step of creating at least one other data file associated with the new set, written in another format, and containing the new three-dimensional positioning matrix together with pointers to the files written in said other format, associated with the geometrical representations of the pre-existing elements of the set and a pointer to the CAD file associated with the geometrical representation of the new component written in said other format;

for each other file format, a step of creating a link in said data structure between the identifier of the new set and the data file written in said other format;

for each file format, a step of copying links into the data structure between the identifiers of the elements of the pre-existing set and their associated geometrical representation CAD files; and a step of updating in the data structure the positioning vectors of the elements of the new set from the new three-dimensional positioning matrix.

It can thus be understood that adding a new element into the parts list, e.g. a new component or a new set of components, is followed by new data files being created in the CAD model, which files correspond to the newly-created element. Furthermore, there are as many data files created as there are native formats used.

Thereafter, when the user has positioned the new element in three dimensions in the set, the positioning vectors of the elements of the new set are advantageously updated from the positioning matrix. Thus, the parts list is itself synchronized with the CAD model.

The invention also provides a computer program including instructions for executing the steps of the addition method of the invention when said program is executed by a computer.

The computer program preferably forms part of the parts list management software.

The program may use any programming language and be in the form of source code, object code, or of code intermediate between source code and object code, such as in a partially compiled form, or in any other desirable form.

The invention also provides a recording medium readable by a computer on which the computer program of the invention is recorded, e.g. a hard disk.

Furthermore, the present invention provides a deletion method for deleting a component, referred to as the component for deleting, from a pre-existing set of a parts list of a mechanical device, particularly but not exclusively a helicopter turbine engine, said parts list having a data structure of the invention associated with a CAD model presenting a plurality of file formats, said method comprising:

a step of creating in said data structure an identifier of a new set containing the elements of the pre-existing set other than the component for deleting;

for each file format, a step of creating a data file associated with the new set and written in said format, the data file containing a new positioning matrix generated from a positioning matrix of the elements of the pre-existing set by deleting therefrom the matrix data relating to the positioning of the component for deleting, together with pointers to CAD files containing the geometrical representations in said format of the elements of the pre-existing set other than those of the component for deleting;

for each file format, a step of creating a link in said data structure between the identifier of the new set and the data file written in said format;

a step of copying, into the data structure, links between the identifiers of the elements of the pre-existing set other than those of the component for deleting and their associated CAD files; and a step of updating, in the data structure, positioning vectors of the elements of the new set from the new three-dimensional positioning matrix.

Deleting an element is therefore accompanied by creating a new data file associated with the new set that no longer includes a pointer to the CAD file containing the geometrical representation of the deleted elements, and that no longer contains matrix data relating to the three-dimensional positioning of said deleted element.

Preferably, the data files associated with the pre-existing set are deleted.

It can thus be understood, once more, that when an element is deleted from the parts list, the CAD model is advantageously updated.

By means of the invention, the parts list is thus synchronized with the CAD model whenever an element is added to or deleted from the parts list.

The invention also provides a computer program including instructions for executing the steps of the deletion method of the invention when said program is executed by a computer.

The computer may use any programming language, and it may be in the form of source code, object code, or code intermediate between source code and object code, such as in a partially compiled form, or in any other desirable form.

The program preferably forms part of the parts list management software.

Finally, the invention provides a recording medium readable by a computer and having recorded thereon the above-mentioned computer program.

By way of non-exclusive example, such a recording medium is a hard disk, a non-volatile memory, a CD, or indeed a DVD.

The present invention also provides a method of designing or fabricating a mechanical device, e.g. a turbomachine, said device presenting a parts list comprising at least one set including at least one element selected from a component or a set of components, the method comprising the step of generating:

a CAD file containing the geometrical representation of the element; and a data file containing a three-dimensional positioning matrix for said at least one element of the set together with at least one pointer to said CAD file containing the geometrical representation of the element of the set;

and the steps of calculating a three-dimensional positioning vector for said element, and of creating a data structure of the parts list, the data structure comprising:

an identifier of the set;

an identifier of the element;

at least one link between the identifier of the element and the CAD file containing the geometrical representation of the element;

at least one link between the identifier of the set and the data file containing a three-dimensional positioning matrix for said at least one element of the set; and the positioning vector.

Advantageously, the design method further includes an addition method for adding a new component in a pre-existing set of the parts list of the mechanical device, the data structure of the parts list being associated with a CAD model presenting a plurality of file formats, said addition method comprising:

a step of creating in said data structure an identifier of a new set containing the elements of the pre-existing set and the new component;

a step during which a native CAD file is provided that contains the geometrical representation of the new component in a first format;

a step of creating at least one other CAD file containing the geometrical representation of the new component in at least one other format, by translating said native CAD file to said other format;

a step of creating in said data structure a first link between the identifier of the new component and the native CAD file;

for each other format, a step of creating a link in the data structure between the identifier of the new component and the CAD file written in said other format;

a step of creating a first data file associated with the new set, written in the first format, and containing a new three-dimensional positioning matrix constituted by the three-dimensional positioning matrix of the elements of the pre-existing set and a new component positioning vector, together with pointers to the CAD files written in the first format and associated with the geometrical representations of the elements of the pre-existing set, and a pointer to the native CAD file;

a step of creating a first link in said data structure between the identifier of the new set and the first data file;

a step of creating at least one other data file associated with the new set, written in another format, and containing the new three-dimensional positioning matrix together with pointers to the files written in said other format, associated with the geometrical representations of the pre-existing elements of the set and a pointer to the CAD file associated with the geometrical representation of the new component written in said other format;

for each other file format, a step of creating a link in said data structure between the identifier of the new set and the data file written in said other format;

for each file format, a step of copying links into the data structure between the identifiers of the elements of the pre-existing set and their associated geometrical representation CAD files; and a step of updating in the data structure the positioning vectors of the elements of the new set from the new three-dimensional positioning matrix.

Advantageously, the design method further comprises a method of deleting a component, referred to as the component for deleting, from a pre-existing set of the parts list of the mechanical device, said data structure of the parts list being associated with a CAD model comprising a plurality of file format, the deletion method comprising:

a step of creating in said data structure an identifier of a new set containing the elements of the pre-existing set other than the component for deleting;

for each file format, a step of creating a data file associated with the new set and written in said format, the data file containing a new positioning matrix generated from a positioning matrix of the elements of the pre-existing set by deleting therefrom the matrix data relating to the positioning of the component for deleting, together with pointers to CAD files containing the geometrical representations in said format of the elements of the pre-existing set other than those of the component for deleting;

for each file format, a step of creating a link in said data structure between the identifier of the new set and the data file written in said format;

a step of copying, into the data structure, links between the identifiers of the elements of the pre-existing set other than those of the component for deleting and their associated CAD files; and a step of updating, in the data structure, positioning vectors of the elements of the new set from the new three-dimensional positioning matrix.

According to the invention, the above-mentioned design method is implemented by a computer program stored on a recording medium.

The invention can be better understood and its advantages appear better on reading the following description of various implementations given as non-limiting examples. The description refers to the accompanying drawings, in which.

The following detailed description is based on an example application of the data structure of the invention. Specifically, the example relates to designing a mechanical device forming part of a turbine engine for an aircraft of the helicopter type. Naturally, the invention is not limited to designing a helicopter turbine engine and it can be used for designing any type of device made up of a plurality of components and possessing a parts list. The invention relates preferably to devices for which industrial design is associated with creating and managing CAD type computer files that contain geometrical representations of the various parts making up the device.

Figure 1:
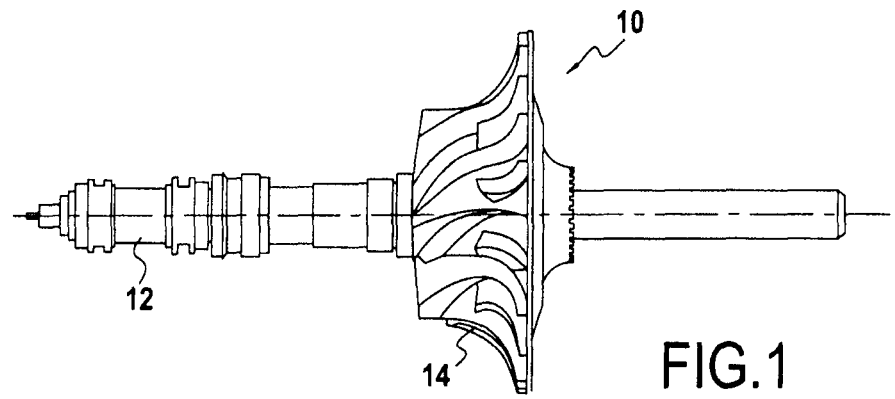
FIG. 1 is a geometrical representation of a pre-existing set in the parts list of a mechanical device, specifically a rotary assembly of the gas turbine of a helicopter turbine engine, this set of components comprising a shaft and a compressor wheel.

FIG. 1 shows a rotary assembly 10 of a gas turbine of a helicopter turbine engine, this rotary assembly comprising a rotary shaft 12 having a centrifugal compressor wheel 14 mounted thereon.

Figure 2A:
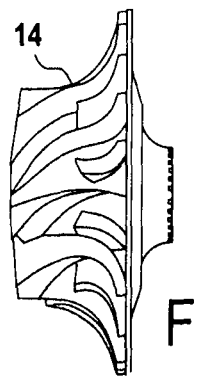
FIG. 2A is a geometrical representation of a first component of the FIG. 1 rotary assembly, namely the compressor wheel.
Figure 2C:
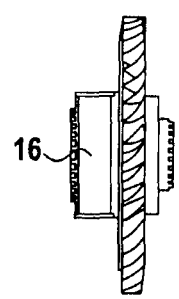
FIG. 2C is a geometrical representation of a third component, namely the high pressure wheel.
Figure 2B:
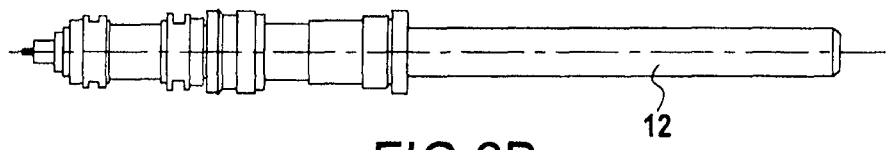
FIG. 2B is a geometrical representation of a second component of the FIG. 1 mechanical device, namely the shaft.

This assembly is thus made up of two parts, namely the compressor wheel, shown in FIG. 2A, and the rotary shaft, shown in FIG. 2B.

In the parts list of this mechanical device, the rotary shaft 12 constitutes a first component, the compressor wheel 14 constitutes a second component, and the rotary assembly 10 constitutes a set of components referred to below as a "set".

In other words, in the parts list, a set of components may comprise elements of two types: a component or a set of components, thereby enabling a tree structure to be defined.

The parts list is managed by parts list management software also known as product lifecycle management (PLM) software.

In the invention, the parts list presents a data structure 100 that is described below with reference to FIGS. 4 to 6.

Figure 4:
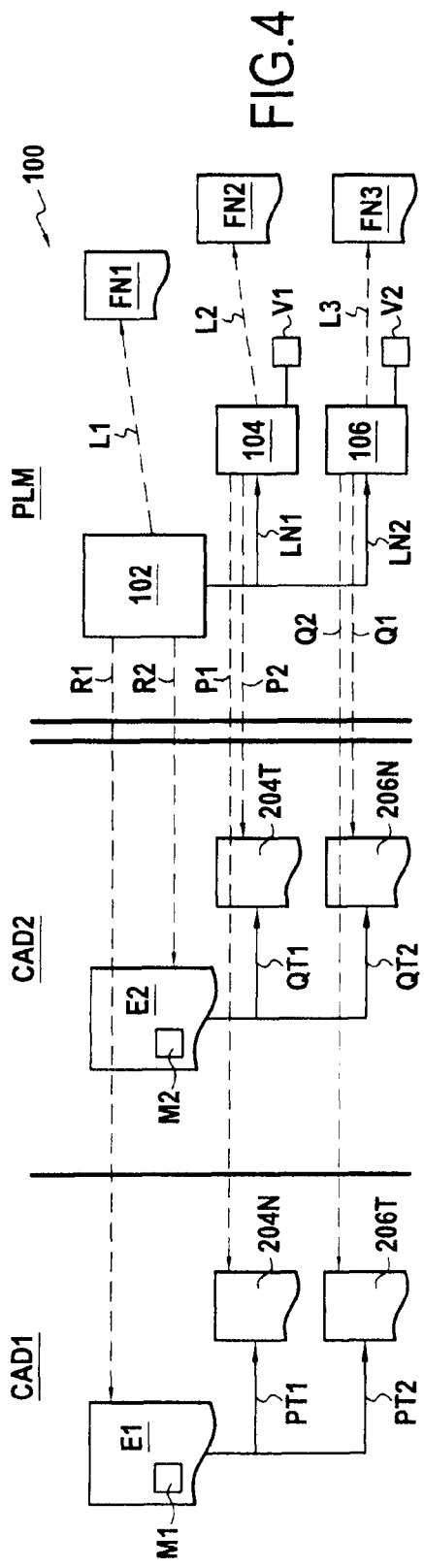
FIG. 4 shows the data structure of the invention for the parts list of the pre-existing set of components shown in FIG. 1, together with the associated CAD model.
Figure 5:
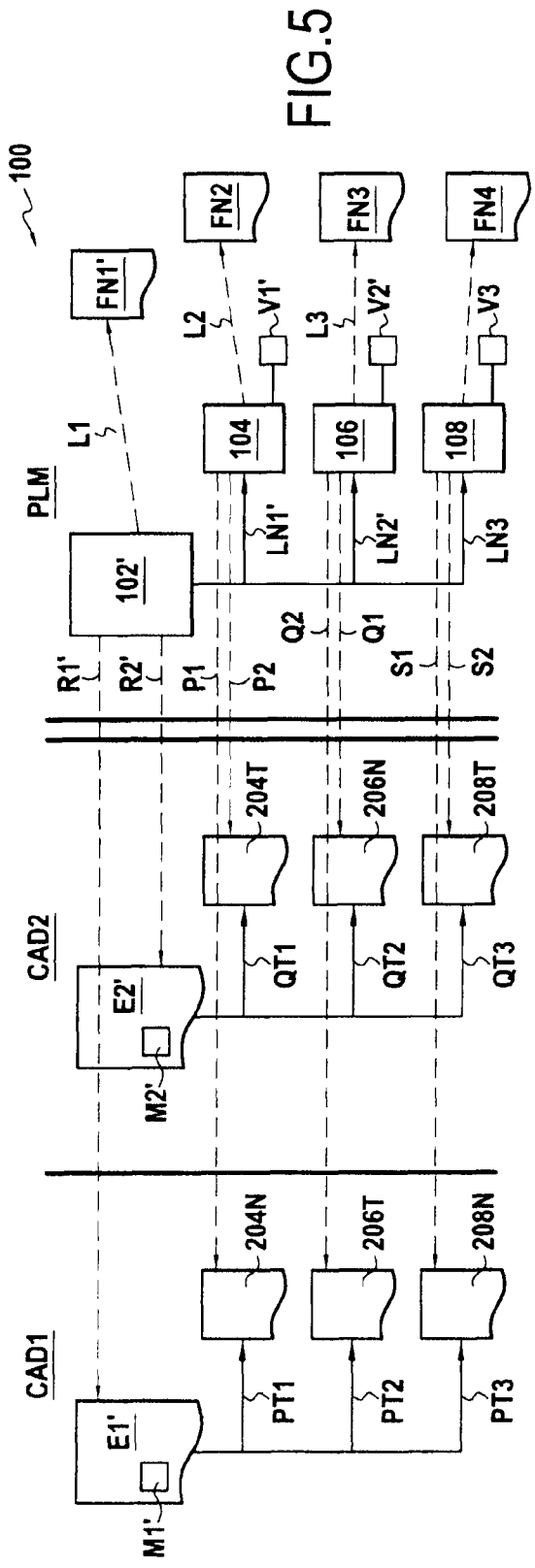
FIG. 5 shows the data structure of the invention for the parts list of the new set of components shown in FIG. 3, together with the associated CAD model.
Figure 6:
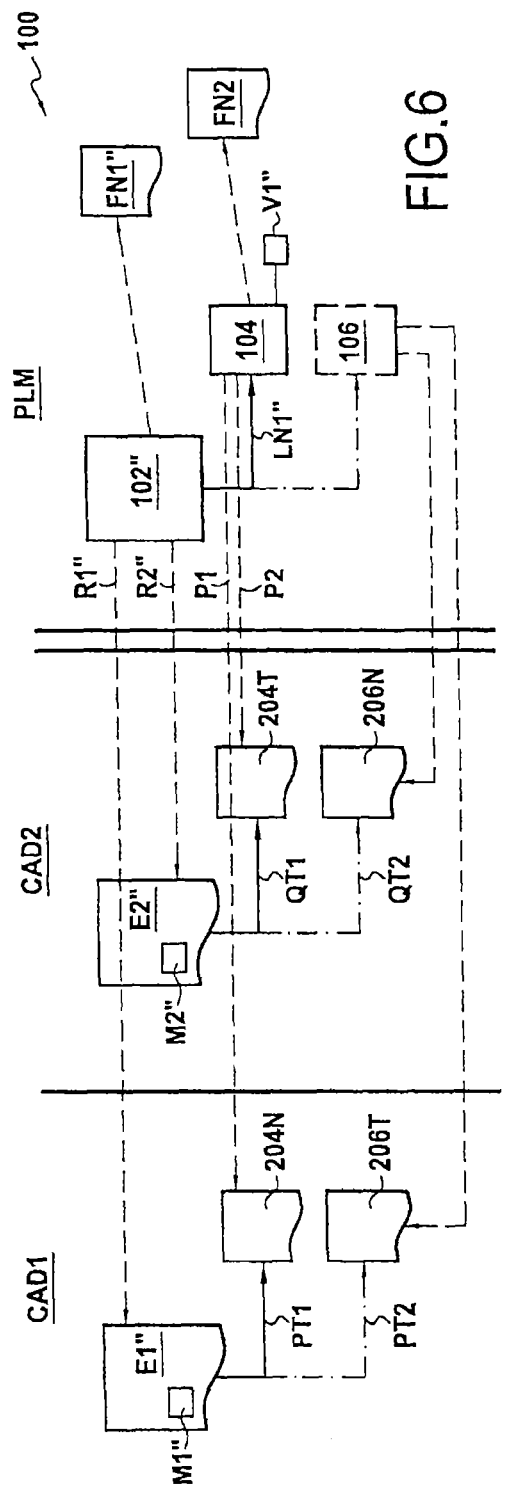
FIG. 6 shows the data structure of the invention for the parts list of the FIG. 5 set of components after deleting the second component, together with the associated CAD model.
Figure 7:
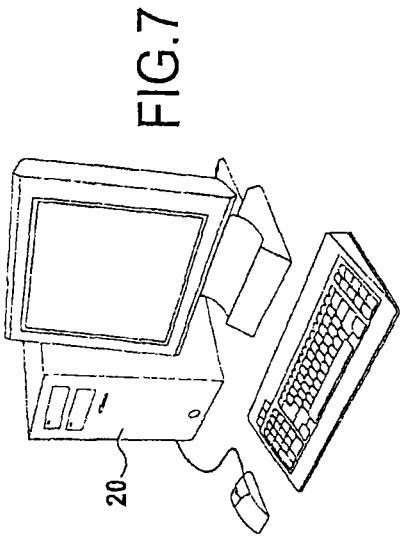
FIG. 7 shows a computer on which parts-list management software is installed that incorporates the data structure of the invention.
Figure 8:
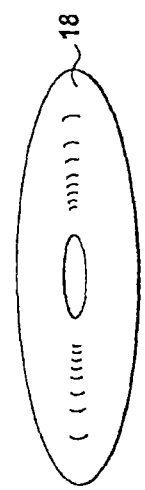
FIG. 8 shows a recording medium readable by the FIG. 7 computer and having the data structure of the invention stored thereon.

The data structure of the parts list is shown diagrammatically in each of FIGS. 4 to 6 on the right-hand side of the pair of vertical lines, while the CAD model of the mechanical device 10 is shown diagrammatically on the left-hand side of the pair of vertical lines, the model comprising the CAD files containing the geometrical representations of the various elements of the mechanical device.

Specifically, the data structure 100 of the invention includes an identifier 102 for the "rotary assembly 10" set, an identifier 104 for the first component, the "rotary shaft 12", and an identifier 106 for the second component, the "compressor wheel 14".

The term "identifier" is used to designate the article reference given to the component or to the set of components. The identifier is preferably made up of a number or a code that enables the associated element to be identified.

As can be seen in FIG. 4, the identifiers 104 and 106 of the first and second components are linked to the identifier 102 of the set by previously-created links LN1 and LN2 of the parts list.

In an advantageous aspect of the invention, the data structure 100 also includes, for each element 102, 104, 106, a link L1, L2, L3 to a CAD file FN1, FN2, FN3 containing the geometrical representation of the element in question in a neutral format.

Thus, for example, the identifier 104 of the first component is linked by the link L2 to the CAD file FN2 containing the geometrical representation of the shaft 12 in a neutral format. The user can thus view the shaft 12 directly using the parts list management software. The neutral format, of the STEP or IGES type, is preferably obtained by translation of the native CAD file into said neutral format, i.e. by translating the CAD file created by the software package that was used for designing the component.

The same applies for the identifier 106 of the first component 14 and to the identifier 102 of the set as a whole.

In this example, the native CAD file 204N of the first component 12 was generated in a first CAD file format CAD1 by a first CAD package, whereas the native CAD file 206N for the second component 14 was generated in a second CAD format CAD2 by a second CAD package.

A CAD file 204T that has been translated into a format compatible with the second format, e.g. a neutral format, was generated by an electronic translator of known kind on the basis of the native CAD file 204N written in the first format, while a CAD file 206T that has been translated into a format compatible with the first format, e.g. a neutral format, was generated by a translator from the native CAD file 206N written in the second format.

In other words, the translated CAD file 204T is readable by the second package. This means that the geometrical representation of the component 12 can be viewed in the second package, but cannot be modified with the second package.

Likewise, the translated CAD file 206T is readable in the first package. This means that the geometrical representation of the second component 14 can be viewed in the first package, but that it cannot be modified by said first package.

According to the invention, the data structure 100 includes a first link P1 between the identifier 104 of the first component 12 and the native CAD file 204N containing the geometrical representation of the first component in the first format, and a second link P2 between the identifier 104 of the first component 12 and the translated CAD file 204T also containing the geometrical representation of the first component.

Similarly, the data structure 100 includes a first link Q1 between the identifier 106 of the second component 14 and the native CAD file 206N containing the geometrical representation of the second component in the second format, and a second link Q2 between the identifier 106 of the second component 14 and the translated CAD file 206T also containing the geometrical representation of the second component.

Furthermore, still according to the invention, the data structure 100 includes both a first link R1 between the identifier 102 of the set and a first data file E1, written in the first format, and also a second link R2 between the identifier 102 of the set and a second data file E2 written in the second format.

The first data file E1 contains a first pointer PT1 to the first native CAD file 204N of the first component 12, and a second pointer PT2 to the translated CAD file 206T of the second component 14.

The data file E1 also contains a three-dimensional positioning matrix M1 for the first and second components 12 and 14 in the set constituted by the rotary assembly 10.

The positioning matrix M1 thus contains matrix data relating to the positioning of these two components.

Thus, when the user opens the first data file E1 with the first software package, that package can find the geometrical representations of the first and second components by using the first and second pointers PT1 and PT2, and can then position the first component 12 and the second component 14 in three dimensions by making use of the data from the matrix M1. It can thus be understood that opening the data file E1 with the first software package makes it possible in particular to view the rotary assembly 10 as shown in FIG. 1, and to do so even though the second component was designed using the second software package.

As a result, the user can modify the geometrical representation of the first component 12 while being able to view the second component 14. This is particularly advantageous if the modification to be made to the first component 12 needs to take account of the shape of the second component 14.

Similarly, the second data file E2 contains a positioning matrix M2 similar to the matrix M1, together with pointers QT1 and QT2 to the CAD files 204T and 206N of the first and second components.

Consequently, when the user opens the second data file E2 with the second software package, that package can find the geometrical representations of the first and second components by means of the first and second pointers QT1 and QT2 and it can then position the first component 12 and the second component 14 in three dimensions on the basis of the data from the matrix M2. It can thus be understood that opening the second data file E2 with the second software package makes it possible in particular to view the rotary assembly 10 as shown in FIG. 1, and to do this even though the first component was designed with the first software package.

As a result, the user can modify the geometrical representation of the second component while being able to view the first component. This is particularly advantageous if the modification to be made to the second component needs to take account of the shape of the first component.

The present invention thus enables the user to work with CAD files that are written in two different formats, while having only one parts list.

In accordance with the invention, the data structure 100 also includes a positioning vector V1 for positioning the first component in the set, preferably associated with the identifier 104 of the first component 12, and also a positioning vector V2 for positioning the second component in the set, preferably associated with the identifier 106 of the second component 14. These vectors are advantageously updated from one or the other of the positioning matrices M1 and M2. In order to do this, the parts list management software recovers, from these matrices M1 and M2, positioning information specific to each of the components, this information taking the place of the old positioning vectors V1 and V2 if a component position has been modified.

An advantage of these vectors lies in particular in being able to position the geometrical representations of the files FN2 and FN3 in such a manner as to enable the set to be viewed directly in the parts list software.

The data structure 100 of the invention is preferably recorded on a recording medium, e.g. a CD 18 suitable for being read by a computer 20. Naturally, and without going beyond the ambit of the invention, the data structure 100 may equally well be stored on the hard disk of the computer 20 or in a server (not shown) to which the computer 20 is connected.

Figure 3:
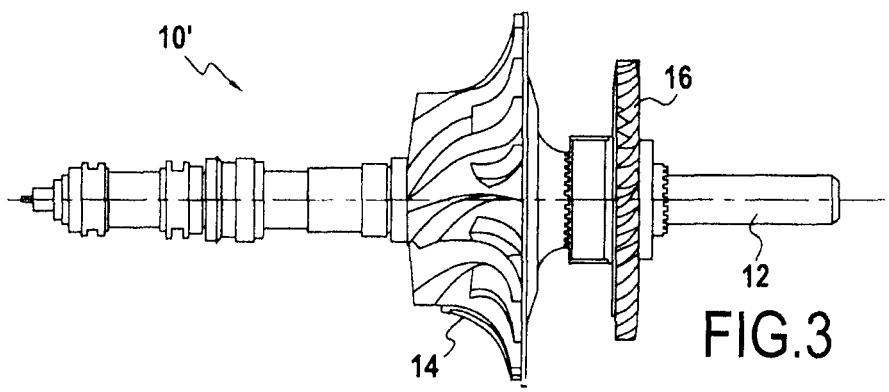
FIG. 3 is a geometrical representation of a new set of components of the parts list obtained after adding the third component of FIG. 2C to the pre-existing set of parts shown in FIG. 1.

With reference to FIG. 5, there follows a description of an addition method for adding a third component 16 to a pre-existing set, specifically the set 10 shown in FIG. 1, where the third component 16 is the component shown in FIG. 2C, i.e. a high-pressure turbine wheel 16. In known manner, this turbine wheel is fastened to the rotary shaft 12. The resulting new set 10' corresponds to the assembly shown in FIG. 3. It comprises the elements of the pre-existing set, i.e. the first and second components 12 and 14, together with the additional component 16.

Firstly, a new identifier 102' is created in the data structure 100 for this new set 10', and a new identifier 108' is created for the third component 16 that is to be added, if such an identifier does not already exist. Thereafter, links LN1', LN2', and LN3 are created in the parts list between the new identifier 102' and the identifiers 104, 106, and 108 of the first, second, and third components 12, 14, and 16 in order to specify that these three components belong to a new set.

Furthermore, a native CAD file 208N is provided that contains the geometrical representation of the first component 16, written in a first format, e.g. in the above-mentioned first format. In other words, and specifically, the geometrical representation of the third component as can be seen in FIG. 2C is created in this example using the first software package, thereby generating this native CAD file 208N. It should be specified that the geometrical representation of the third component 16 could equally well have been made from some other software package without going beyond the ambit of the present invention.

Thereafter, from this native CAD file 208N written in the first format, another CAD file 208T is created that represents the third component 16, this being done by translating said native file 208N to another format that is compatible with the above-mentioned second format.

In the invention, a first link S1 is created in the data structure 100 between the identifier 108 of the third component and the associated native CAD file 208N. A second link S2 is also created between the identifier 108 of the third component 16 and the associated translated CAD file 208T.

Furthermore, a first data file E1' is created that is associated with the new set 10', which file is written in the first format and contains a new three-dimensional positioning matrix M1' constituted by the three-dimensional positioning matrix M1 for the first and second components together with a positioning vector for positioning the third component 16 in the new set.

This matrix M1' is created after the drafter has used the first software package to position the third component 16 in three dimensions in the new set.

This first data file E1' also contains pointers PT1, PT2, and PT3 to each of the three CAD files 204N, 206T, and 208N, the pointers PT1 and PT2 preferably being copied from the first data file E1 of the pre-existing set.

Thereafter, a first link R1' is created between the first identifier 102' of the new set and the first data file E1' that has just been created.

Furthermore, another data file E2' is created that is likewise associated with the new set, and that is written in another format, preferably the above-mentioned second format so as to be capable of being opened with the second software package. In this other data file E2', a three-dimensional positioning matrix M2' is created from the three-dimensional positioning matrix M1' of the first data file E1'. Pointers QT1, QT2, and QT3 are also created to the CAD files 204T, 206N, and 208T, the pointers QT1 and QT2 preferably being copied from the second data file E2 of the pre-existing set shown diagrammatically in FIG. 4.

Thereafter, a second link R2' is created between the identifier 102' of the new set and the second data file E2' that has just been created.

Thereafter, the links P1, P2, Q1, and Q2 are copied that exist between the identifiers of the first and second components 104, 106 and the CAD files 204N, 204T, 206N, and 206T.

Finally, the positioning vectors V1', V2', and V3 of the three components are updated from the new positioning matrix M1' or M2'.

It can be understood that the addition method of the invention constraints the CAD model, i.e. the CAD files and the data files, to be organized like the data structure of the parts list. An advantage as mentioned above is that this provides a CAD structure that is synchronized with the parts list.

With reference to FIG. 6, there follows a description of another aspect of the invention, i.e. a deletion method for deleting a component from a pre-existing set, e.g. the set shown in FIG. 1, which component is referred to as the "component for deleting".

In this example, the starting point is the data structure of FIG. 4 and the associated CAD model, presenting the native format CAD1 and CAD2. The pre-existing set in the parts list comprises the first and second components 12 and 14, and it is the second component 14 that is to be deleted from this pre-existing set. Naturally, in another example, the deletion method could be implemented to delete one of the three components from the set 102' shown in FIG. 5.

For this purpose, and in accordance with the invention, a new identifier 102" is created in the data structure 100 for the new set that comprises solely the first component 12. This new identifier 102" is linked to the identifier 104 of the first component 12 by a parts list link LN1", the parts list link to the identifier 106 of the second component 14 being deleted.

Thereafter, a first data file E1" is created in the first format, including a three-dimensional positioning matrix M1" generated from the positioning matrix Ml for the elements of the pre-existing set. To do this, the matrix data relating to the three-dimensional position of the second component 14 in the pre-existing set is deleted from the matrix M1.

Into this first data file E1", there is also copied the pointer PT1 to the native CAD file 204N that contains the geometrical representation of the first component in the first format.

It can also be understood that the pointer PT2 to the CAD file 206T is not copied.

The same operation is performed for the second format: a second data file E2" is created in the second native format CAD2, that includes a three-dimensional positioning matrix M2" that is generated from the positioning matrix M2 for the elements of the pre-existing set, this three-dimensional positioning matrix M2" possibly being identical to the matrix M1" of the first data file E1".

Into this second data file E2", there is also copied the pointer QT1 to the translated CAD file 204T containing the geometrical representation of the first component in a format that is compatible with the second format CAD2.

It can also be understood that the pointer QT2 to the CAD file 206N is not copied.

Thereafter, a first link R1" is created in the data structure 100 between the identifier 102" of the new set and the first data file E1", together with a second link R2" between said identifier 102" of the new set and the second data file E2".

Thereafter, the links P1 and P2 between the identifier 104 of the first component 12 and the CAD files 204N and 204T that contain the geometrical representation of said first component 12 are also copied.

Finally, the positioning vector V1" of the first component 12 is updated in the data structure, e.g. from the positioning matrix M1" of the first data file M1" of the new set.

Thus, the deletion method of the invention likewise enables the CAD model to be organized advantageously like the data structure of the parts list.

The invention claimed is:

1. A method for modeling a mechanical device or a turbomachine, the device or turbomachine presenting parts list including at least one set including at least one element selected from a component or a set of components, the method comprising:
   generating:
      a CAD file containing a geometrical representation of the element; and
      a data file containing a three-dimensional positioning matrix for the at least one element of the set together with at least one pointer to the CAD file containing the geometrical representation of the element of the set; and
   calculating a three-dimensional positioning vector for the element, and creating a data structure of the parts list, the data structure comprising:
   an identifier of the set;
   an identifier of the element;
   at least one link between the identifier of the element and the CAD file containing the geometrical representation of the element;
   at least one link between the identifier of the set and the data file containing a three-dimensional positioning matrix for the at least one element of the set; and
   the positioning vector.

2. A method according to claim 1, further comprising an addition method for adding a new component in a pre-existing set of the parts list of the mechanical device, the data structure of the parts list being associated with a CAD model presenting a plurality of file formats, the addition method comprising:
   creating in the data structure an identifier of a new set including the elements of the pre-existing set and the new component;
   providing a native CAD file that includes the geometrical representation of the new component in a first format;
   creating at least one other CAD file including a geometrical representation of the new component in at least one other format, by translating the native CAD file to the other format;
   creating in the data structure a first link between the identifier of the new component and the native CAD file;
   for each other format, creating a link in the data structure between the identifier of the new component and the CAD file written in the other format;
   creating a first data file associated with the new set, written in the first format, and including a new three-dimensional positioning matrix constituted by the three-dimensional positioning matrix of the elements of the pre-existing set and a new component positioning vector, together with pointers to the CAD files written in the first format and associated with the geometrical representations of the elements of the pre-existing set, and a pointer to the native CAD file;
   creating a first link in the data structure between the identifier of the new set and the first data file;
   creating at least one other data file associated with the new set, written in another format, and including the new three-dimensional positioning matrix together with pointers to the files written in the other format, associated with the geometrical representations of the pre-existing elements of the set and a pointer to the CAD file associated with the geometrical representation of the new component written in the other format;
   for each other file format, creating a link in the data structure between the identifier of the new set and the data file written in the other format;
   for each file format, copying links into the data structure between the identifiers of the elements of the pre-existing set and their associated geometrical representation CAD files; and
   updating in the data structure the positioning vectors of the elements of the new set from the new three-dimensional positioning matrix.

3. A method according to claim 1, further comprising a method of deleting a component for deleting, from a pre-existing set of the parts list of the mechanical device, the data structure of the parts list being associated with a CAD model comprising a plurality of file format, the deletion method comprising:
   creating in the data structure an identifier of a new set containing the elements of the pre-existing set other than the component for deleting;
   for each file format, creating a data file associated with the new set and written in the format, the data file including a new positioning matrix generated from a positioning matrix of the elements of the pre-existing set by deleting therefrom the matrix data relating to the positioning of the component for deleting, together with pointers to CAD files containing the geometrical representations in the format of the elements of the pre-existing set other than those of the component for deleting;

for each file format, creating a link in the data structure between the identifier of the new set and the data file written in the format;

copying, into the data structure, links between the identifiers of the elements of the pre-existing set other than those of the component for deleting and their associated CAD files; and updating, in the data structure, positioning vectors of the elements of the new set from the new three-dimensional positioning matrix.

4. A non-transitory computer-readable storage medium storing a program, when executed, causes a computer to perform the method according to claim 1.

5. A non-transitory computer readable medium having stored thereon a data structure for a parts list of a mechanical device, the parts list comprising at least one set including at least one element selected from a component or a set of components, the data structure comprising:

an identifier of the set;

an identifier of the element;

at least one link between the identifier of the element and at least one CAD file containing the geometrical representation of the element;

at least one link between the identifier of the set and at least one data file including a three-dimensional positioning matrix of the at least one element of the set, together with at least one pointer to the CAD file containing the geometrical representation of the element of the set; and a three-dimensional positioning vector for positioning the element in the set.

6. A non-transitory computer readable medium according to claim 5, further comprising a program, when executed by a computer, for updating the three-dimensional positioning vector from the three-dimensional positioning matrix.

7. A non-transitory computer readable medium according to claim 5, wherein the at least one element is a component and the data structure includes a first link between the identifier of the component and a first CAD file including the geometrical representation of the component in a first format, and at least one second link between the identifier of the component and a second CAD file containing a geometrical representation of the component in a second format.

8. A non-transitory computer readable medium according to claim 7, further comprising:

a first link between the identifier of the set and a first data file including:

the three-dimensional positioning matrix; and a pointer to the first CAD file; and a second link between the identifier of the set and a second data file including:

the three-dimensional positioning matrix; and a pointer to the second CAD file.

9. A non-transitory computer readable medium according to claim 5, further comprising, for each element, a link to a file containing a geometrical representation of the element in a neutral format.

10. A non-transitory computer readable medium according to claim 5, further comprising a program for an addition method of adding a new component to a pre-existing set of a parts list of a mechanical device, the parts list including the data structure, the data structure being associated with a CAD model presenting a plurality of file formats, the program, when executed by a computer, performing the method comprising:

creating in the data structure an identifier of a new set including the elements of the pre-existing set and the new component;

providing a native CAD file that includes a geometrical representation of the new component written in a first format;

creating at least one other CAD file including a geometrical representation of the new component written in at least one other format, by translating the native CAD file to the other format;

creating in the data structure a first link between the identifier of the new component and the native CAD file;

for each other format, creating a link in the data structure between the identifier of the new component and the CAD file including the geometrical representation of the new component written in the other format;

creating a first data file associated with the new set, written in the first format, and including a new three-dimensional positioning matrix constituted by the three-dimensional positioning matrix of the elements of the pre-existing set and a new component positioning vector, together with pointers to the CAD files written in the first format and including the geometrical representations of the elements of the pre-existing set, and a pointer to the CAD file including the geometrical representation of the new component written in the first format;

creating a first link in the data structure between the identifier of the new set and the first data file;

creating at least one other data file associated with the new set, written in another format, and including the new three-dimensional positioning matrix together with pointers to the files written in the other format, associated with the geometrical representations of the pre-existing elements of the set and a pointer to the CAD file including the geometrical representation of the new component written in the other format;

for each other format, creating a link in the data structure between the identifier of the new set and the data file written in the other format;

for each format, copying links into the data structure between the identifiers of the elements of the pre-existing set and their associated geometrical representation CAD files; and updating in the data structure the positioning vectors of the elements of the new set from the new three-dimensional positioning matrix.

11. A non-transitory computer readable medium according to claim 5, further comprising a program for a deletion method for deleting a component, the component for deleting, from a pre-existing set of a parts list of a mechanical device, the parts list including the data structure, the data structure being associated with a CAD model presenting a plurality of file formats, the program, when executed by a computer, performing the method comprising:

creating in the data structure an identifier of a new set containing the elements of the pre-existing set other than the component for deleting;

for each file format, creating a data file associated with the new set and written in the format, the data file including a new positioning matrix generated from a positioning matrix of the elements of the pre-existing set by deleting therefrom the matrix data relating to the positioning of the component for deleting, pointers to the CAD files, including the geometrical representations in the format of the elements of the pre-existing set other than those of the component for deleting;

for each file format, creating a link in the data structure between the identifier of the new set and the data file written in the format;

copying, into the data structure, links between the identifiers of the elements of the pre-existing set other than those of the component for deleting and their associated geometrical representation CAD files; and updating, in the data structure, positioning vectors of the elements of the new set from the new three-dimensional positioning matrix.

\* \* \* \* \*